United States Patent [19]
Chen et al.

[11] Patent Number: 5,930,174
[45] Date of Patent: Jul. 27, 1999

[54] CIRCUIT AND METHOD FOR ERASING FLASH MEMORY ARRAY

[75] Inventors: Kou-Su Chen; David K. Y. Liu, both of Fremont, Calif.

[73] Assignee: AMIC Technology, Inc., Santa Clara, Calif.

[21] Appl. No.: 08/988,872

[22] Filed: Dec. 11, 1997

[51] Int. Cl.⁶ ............................. G11C 16/04; G11C 7/00
[52] U.S. Cl. ................. 365/185.29; 365/185.3; 365/185.33; 365/218
[58] Field of Search .......... 365/185.03, 185.19, 365/185.24, 185.29, 185.3, 185.33, 218

[56] References Cited

U.S. PATENT DOCUMENTS

| | | | |
|---|---|---|---|
| 5,132,935 | 7/1992 | Ashmore, Jr. | 365/218 |
| 5,600,593 | 2/1997 | Fong | 365/185.19 |
| 5,642,311 | 6/1997 | Cleveland et al. | 365/185.29 |

OTHER PUBLICATIONS

Endoh, T. et al., "New Write/Erase Operation Technology for Flash EEPROM Cells to Improve the Read Disturb Characteristics," *IEDM*, Apr. 1992, pp. 603–606.

Oyama, K. et al., "A Novel Erasing Technology for 3.3V Flash Memory with 64Mb Capacity and Beyond," *IEDM*, Apr. 1992, pp. 607–610.

Miyawaki, Y. et al., "A New Erasing and Row Decoding Scheme for Low Supply Voltage Operation 16Mb/64Mb Flash EEPROMs," Symposium on VLSI Circuits, 1991, pp. 85–86.

*Primary Examiner*—Trong Phan
*Attorney, Agent, or Firm*—Law+

[57] ABSTRACT

A circuit and method for achieving compressed distributions of erased cell threshold voltages in an EEPROM array is disclosed. The invention, when used to condition flash memory cell arrays, results in increased endurance of such arrays, and eliminates the need for pre-programming operations before a bulk erase can take place. By eliminating the need to pre-program the memory array before each erasure, the process provides a signicant improvement for low power applications, because battery life is extended and write cycle time is enhanced.

38 Claims, 7 Drawing Sheets

CIRCUIT AND METHOD FOR ERASING FLASH MEMORY ARRAY

FIELD OF THE INVENTION

The present invention relates to a circuit and method for erasing a flash memory array so that voltage threshold distributions of cells in the array are tightened (made more uniform) and unnecessary harsh programming of cells is eliminated. The invention is particularly useful for flash EEPROM arrays because program and erase cycles are minimized, thus requiring less power and leading to longer life for such products.

BACKGROUND OF THE INVENTION

In a typical non-volatile flash EEPROM (or EAROM) a memory array is usually erased by erasing an entire block of memory cells. The memory cells are organized along a number of word lines and a number of bit lines. The memory array contains data denoted as '1' and '0', which values are determined by the threshold voltage of the particular cell in question. As is well known, the threshold voltage of the cell, in turn, is determined by the amount of charge stored on the floating gate, which charge therefore dictates the state of the core cell. Accordingly, the data in the core transistor of the flash EEPROM cell is read as a '1' if the core transistor is at an 'on' state, and such data is similarly read as a '0' if the core transistor is at an 'off' state.

A core transistor in the non-volatile flash EEPROM is considered at its 'on' state if the transistor conducts more core cell current than a reference core cell transistor, whereas the core transistor is considered at its 'off' state if it conducts less core cell current than the reference core cell transistor. The amount of current conducted by the core transistor is a direct function of the amount of charge stored on the floating gate, and this in turn affects the turn-on voltage. A number of different operations during normal use of a flash memory cell will affect the charge on the floating gate, and for this reason a substantial amount of effort is made to ensure that such operations effectuate the proper response from such cell (i.e., that a predictable and proper amount of charge remains on such gate after such operation).

One of these typical steps in the use of a flash cell array is an "erase" operation. The purpose of this step is to remove charge from the floating gates, and thus place them into a "1" data state condition. It is very critical to control the threshold voltage distribution in the non-volatile flash EEPROM after each erase operation, since the memory array may be "over" erased; this means that the core cell transistor exhibits a negative threshold voltage. It is apparent that if the flash memory array experiences over-erasure, erroneous data may be retrieved from the memory array. Furthermore, it is even conceivable that the entire non-volatile flash memory may be no longer operated reliably if the floating gate of the cell has so deteriorated that it can no longer acquire meaningul differences in charge so that the difference between an 'on' state and an 'off' state can be detected. This can be true if the cell is extremely leaky, i.e., in the sense that it cannot hold charge. In other cases it is possible that it will render a substantial amount of other cells unusable because it will conduct so much current that it will swamp the "on" current of adjoining cells and make them essentially irrelevant.

Correction of over-erased cells in a non-volatile flash EEPROM, therefore, is a far more critical operation than most because over-erased cells not only cause erratic operation on the said flash memory array, they also greatly reduce the number of times the core array may be re-programmed. Preventing the occurence of over-erased cells in a non-volatile flash memory is therefore extremely desirable; as a corrolary to this, of course, it is apparent that excessive use of embedded erase algorithms should be avoided whenever possible.

To prevent over-erasure, prior art systems have employed a mechanism as shown generally in FIG. 1B. Instead of applying a single "erase" pulse, which might drive a large number of the voltage thresholds of the lower group of cells into an over-erase condition, a first "program" operation is instead effectuated on the entire array. This has the effect of moving all the threshold voltages into the area generally bounded by $Vt_{pmin}$ and $Vt_{pmax}$. Then, a second "erase" operation has the effect of placing the threshold voltages of the cells into the area bounded by $Vt_{emin}$ and $Vt_{emax}$. This procedure is not perfect, however, and a significant number of cells can still end up being over-erased as shown by the dotted line portion of FIG. 1B. These cells, in turn, must be identified, and, if any are found to exist, an erase correction pulse is applied to rectify the threshold voltages. In any event, it is apparent that the above methodology is non-optimal since it requires that the array be first programmed before an erase procedure can occur, and this stressing cycle exacts a toll on the lifespan of a part incorporating such array.

SUMMARY OF THE INVENTION

An object of the present invention, therefore, is to provide a circuit and method of erasing cells in a flash memory array that reduces the need for programming operations in such array, so that electrical stresses on such cells are reduced, and the reliability and operational lifespan of such array can be correspondingly improved;

Another object of the present invention is to provide a circuit and method of erasing flash memory cells so that threshold voltage distributions of such cells are tightened, thereby increasing the functional performance of devices using such cells;

Yet another object of the present invention, is to provide a circuit and method of erasing cells in a flash memory array that reduces power requirements so that such arrays can be used in a wider range of operating environments, including low power battery applications;

Yet another object of the present invention is to provide a circuit and method of adjusting the threshold voltage distributions of over-erased flash memory cells without resorting to a typical and electrically stressful "program" operation, so that the reliability and lifespan of such cells is significantly increased.

These and other objects are achieved by the present invention which adopts a two-part approach to the control of threshold voltage distributions in a flash memory cell array. During a first phase of a first routine, the existence of any over-erased cells is detected. Over-erased cells have a threshold voltage below a threshold voltage $Vt_{emin}$, where $Vt_{emin}$ is a minimum target threshold value for a cell in an erased state. If any such cells are discovered, a first threshold adjustment voltage signal is used during a second phase of the first routine to adjust (correct) threshold voltages of such cells, so that threshold voltages for any of them are pushed into a distribution above a controllable voltage $Vt_{sp}$, which voltage is above $Vt_{emin}$ but below $Vt_{emax}$ (where $Vt_{emax}$ is a maximum target threshold voltage value for a cell in an erased state). During a second routine, the existence of any under-erased cells is detected during a first phase; under-erased cells have a threshold voltage greater than $Vt_{sp}$. Only if any such under-erased cells are found is an erase pulse applied to the entire array. This feature of the present invention is substantially unlike that of the prior art, which always generates a program pulse first to move all the cells into a program state before moving them back to an erased state. After any erase pulse, a convergence cycle is executed which has the effect of adjusting the threshold voltages again of any over-erased cells in a manner analogous to that performed during the first routine. In this way, the distribution of threshold voltages in the arrays is dynamically and continually compressed or tightened.

In this fashion, the distribution of threshold voltages of cells in a flash memory array is carefully controlled, and is kept in such state without an undue amount of write cycling of such cells—i.e., excessive programming and erasing pulses. The adjustment pulses are also unlike prior art programming pulses, in that they are intended to move the threshold voltages into a non-overerased state, and not a fully programmed state in the conventional sense.

An integrated circuit can be manufactured in accordance with the present teachings to include an array of flash memory cells, conventional peripheral support circuitry for such array—including a power supply, row and column address decoders, erase and program pulse generators, a number of sense amplifiers, input/output buffers and a reference cell array—and a control circuit for adjusting the threshold voltages of the cells. The control circuit is configured (i.e., includes an embedded executable program) so that it implements the routines discussed above.

DETAILED DESCRIPTION OF THE INVENTION

From a high level perspective, the present invention utilizes two basic processes to control flash memory array cell threshold voltage (Vt) distribution. The first of these, incorporated in what is generally referred to as an over-erase routine, is described in two flow charts depicted in FIG. 3A and FIG. 3B. The second is incorporated in what is referred to generally as an under-erase routine, and is similarly depicted in flow chart form in FIG. 4A and FIG. 4B. These routines operate to cycle flash core cells of the type shown in FIG. 5, where it can be seen that each such cell includes a drain and source region (denoted as D and S), respectively, a control gate denoted as Vcg, and a floating gate FG. A first smaller P-WELL encloses the core transistor as a substrate, and this well is enclosed by a first N-WELL which is used as an isolation region between a P type substrate P-SUB and the first P-WELL. A first input terminal supplies a voltage signal Vp through heavily doped p+ regions to the first P-WELL, and a second input terminal supplies a voltage signal Vn through heavily doped n+ regions to the first N-WELL.

Figure 3A:
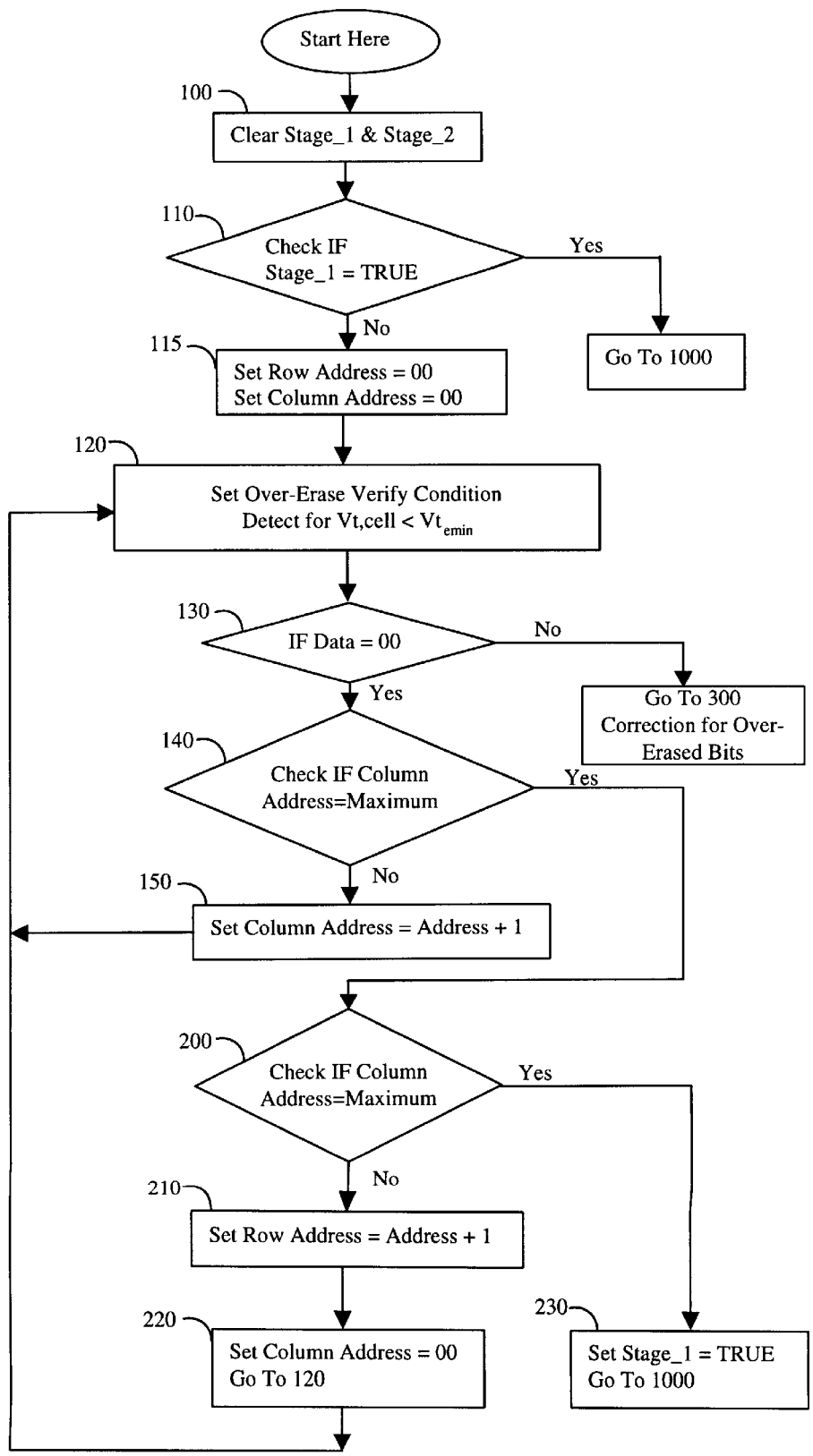
FIG. 3A is a flow chart diagram describing a sequence used in the present invention to detect over-erased cells in a flash EEPROM before any erase is performed.

Continuing with this summary overview, it can be seen that over-erased bits in a flash memory array are detected before erase takes place in the present invention in an over-erase detection routine as the flow chart depicts FIG. 3A. Once any over-erased bits are detected, correction to such over-erased bits is accomplished with an over-erase correction routine. Unlike the prior art, this over-erase correction mechanism does not place the core cell Vt into a highly or fully 'programmed' state in the flash memory array. Instead, the present invention only places over-erased bits in the flash memory into a core cell threshold voltage state in which the leakage current along a bit line is insignificant.

The second portion of the present invention generally provides a mechanism for "tightening" (i.e., making more uniformly close to a target threshold) Vt distribution of the cells after any erases. After each embedded erase of the flash memory array, a convergence cycle is utilized to automatically converge the erased memory array to a predefined core cell voltage Vt, which in a preferred embodiment is equal to $Vt_{emin}$. In this way, the core array is stressed globally to amend any core cells that may have been over-erased during the just completed erase cycle. This ensures that the erased core cell threshold Vt of any cell will never be below a pre-determined lower limit $Vt_{emin}$ for the said flash memory array.

Figure 1:
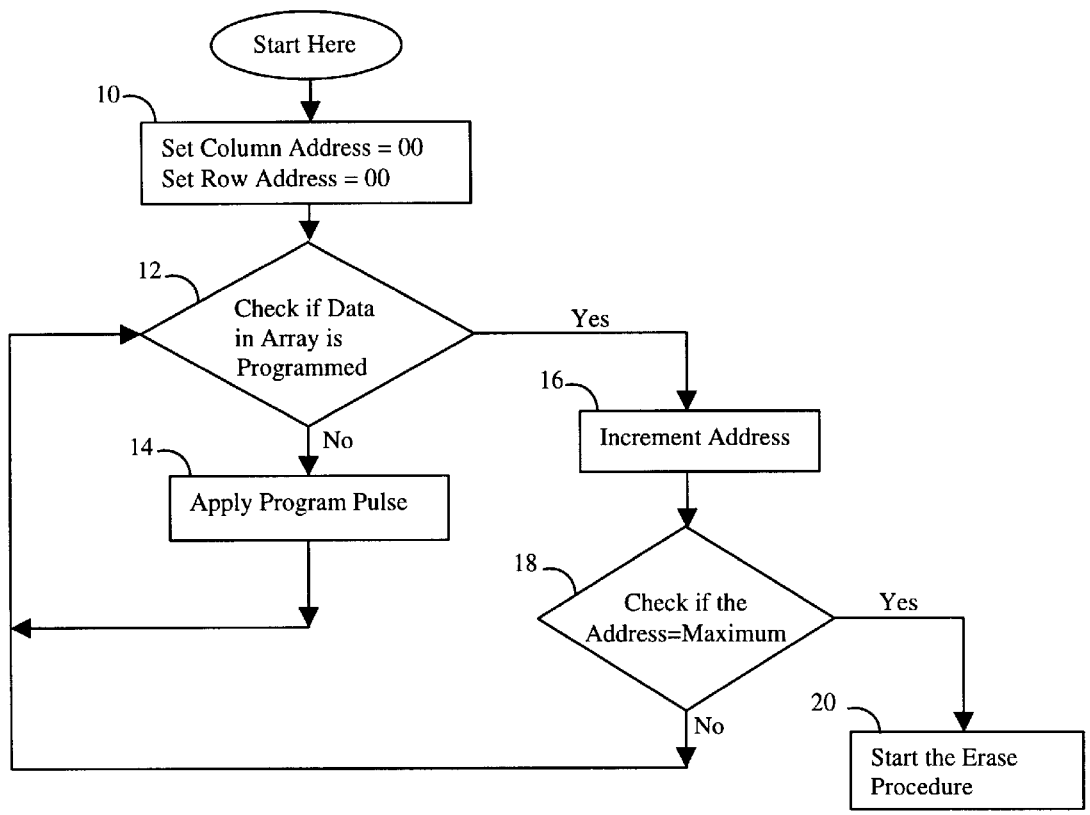
FIG. 1 is a flow chart describing pre-programming steps performed in a prior art scheme before each erase in a single transistor per cell flash EEPROM.

To better understand the present invention, a short description first follows of typical over-erase and under-erase detection and correction mechanisms used in the art. FIG. 1 illustrates a typical prior art mechanism for programming cells of a flash memory array. After an initialization step 10, all bytes in a flash memory array are first verified at step 12 to see if the data is programmed before an erase operation can take place in the flash memory array. If the cells are not already programmed with data, a program pulse is applied as indicated at step 14. If the cells at that particular location are already programmed, the next address is checked as shown at steps 16 and 18. This process is repeated until all bytes have been programmed, at which point the program routine exits at step 20.

Figure 2:
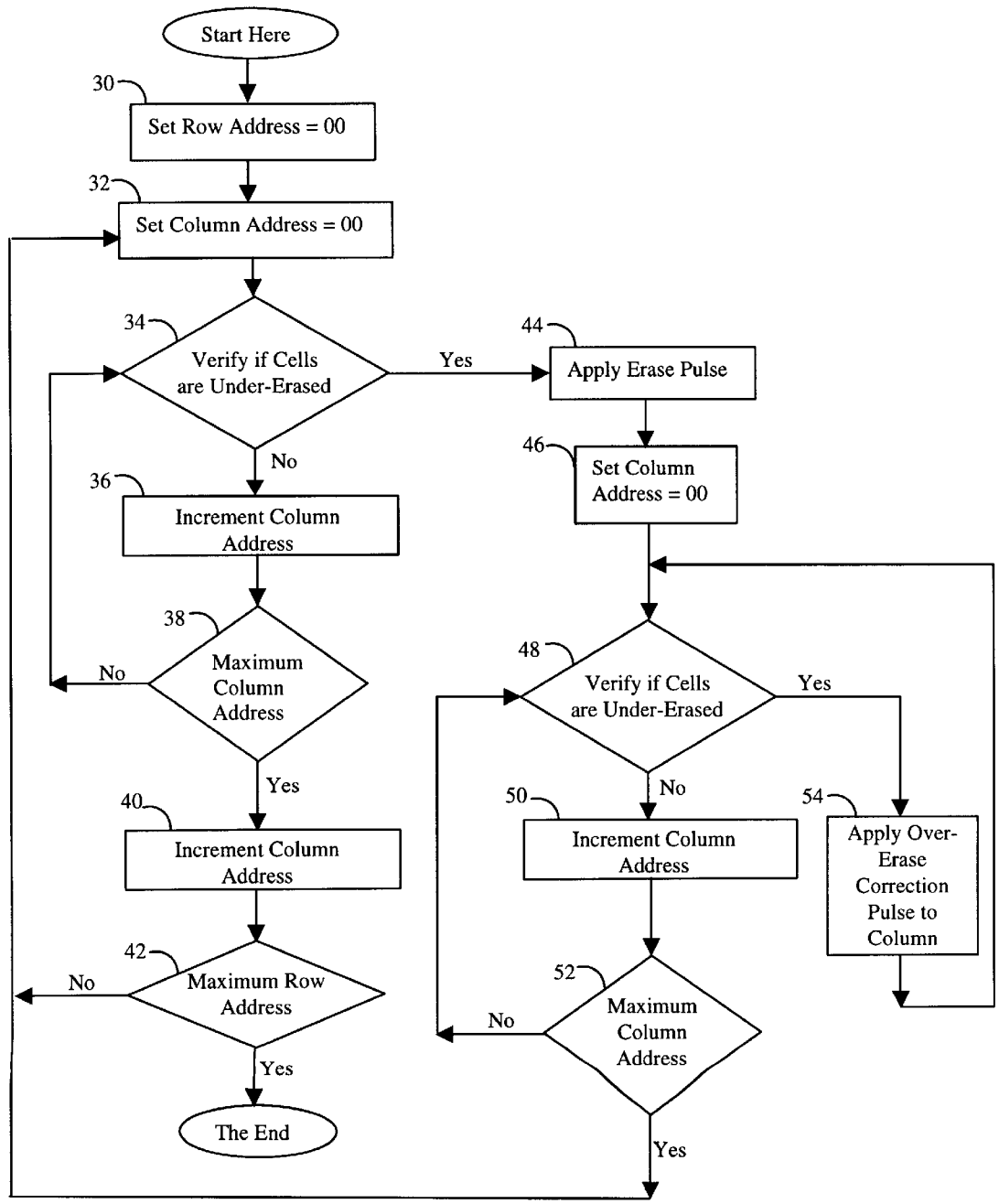
FIG. 2 is a flow chart depicting a prior art sequence for erasing a flash EEPROM.

FIG. 2 describes generally an erase process used in the prior art in which the flash memory array is erased only after all bytes have been pre-programmed. An address counter is initialized at steps 30 and 32. A check is made at step 34 to see if any cells are "under" erased, which from an operational perspective, is essentially a "programmed" condition. If the cell is not under-erased (programmed) a column address is incremented at step 36, and this loop continues until all the cells within a particular row are checked through step 38, at which point a row address pointer is incremented at step 40. If all the rows of the array have not been examined, the process loops back to step 32; otherwise, the program checking portion is completed and the process exits. In the event programmed cells are discovered (i.e., under-erased cells), an erase pulse is applied at step 44 to the entire array. Each column of the array is then checked, beginning at step 46 and then step 48 to see if any cell is "over" erased. If yes, an erase correction pulse is applied to that column at step 54, and the process loops back to step 48; otherwise, the process continues stepping through the array at steps 50 and 52 until all the cells have been examined for over-erasure.

As a first observation it will be noticed that in contrast to the prior art, the present invention does not require pre-programming of all bytes before an erase operation. Instead, as shown in the flow chart of FIG. 3A, the present invention first detects for over-erased bits before each and any erase operations. It should be noted that the routines below are typically implemented in conventional form as embedded executable routines stored in a program memory of an integrated circuit that is accessible by some form of controller (processor) onboard an actual device. Alternatively, they may be executed by an off-chip processor during a manufacturing stage for purposes of cycling and testing flash memory arrays using the processes below. The particular manifestation of the control circuit executing the routines below is not critical, and the present invention is by no means limited to any specific physical embodiment.

Initially, therefore, the present invention conditions the memory cells of a flash array in the following fashion: first, an over-erase detection routine checks at 110 to see if a prior iteration of this same routine has already been completed; if so, it jumps to step 1000 which is an under-erase detection routine discussed more fully below. Assuming the over-erase detection routine has not been previously completed, step 120 begins the process of checking the threshold voltage of each cell in a specified row. At step 130, if any cells in a byte are over erased for any reason, the data for such byte will not read as '00' and the routine jumps to step 300 which is discussed in connection with FIG. 3B. Otherwise, the routine proceeds to steps 140 and 150 to examine the next address. If all column addresses have been verified as in step 140, the routine then determines if all the rows have been verified in step 200. If not, all remaining column addresses in the next row in step 210 and step 220 are then checked. This process continues until all bytes in the array have been completely verified for any over-erased cells and the routine exits at 230.

Figure 3B:
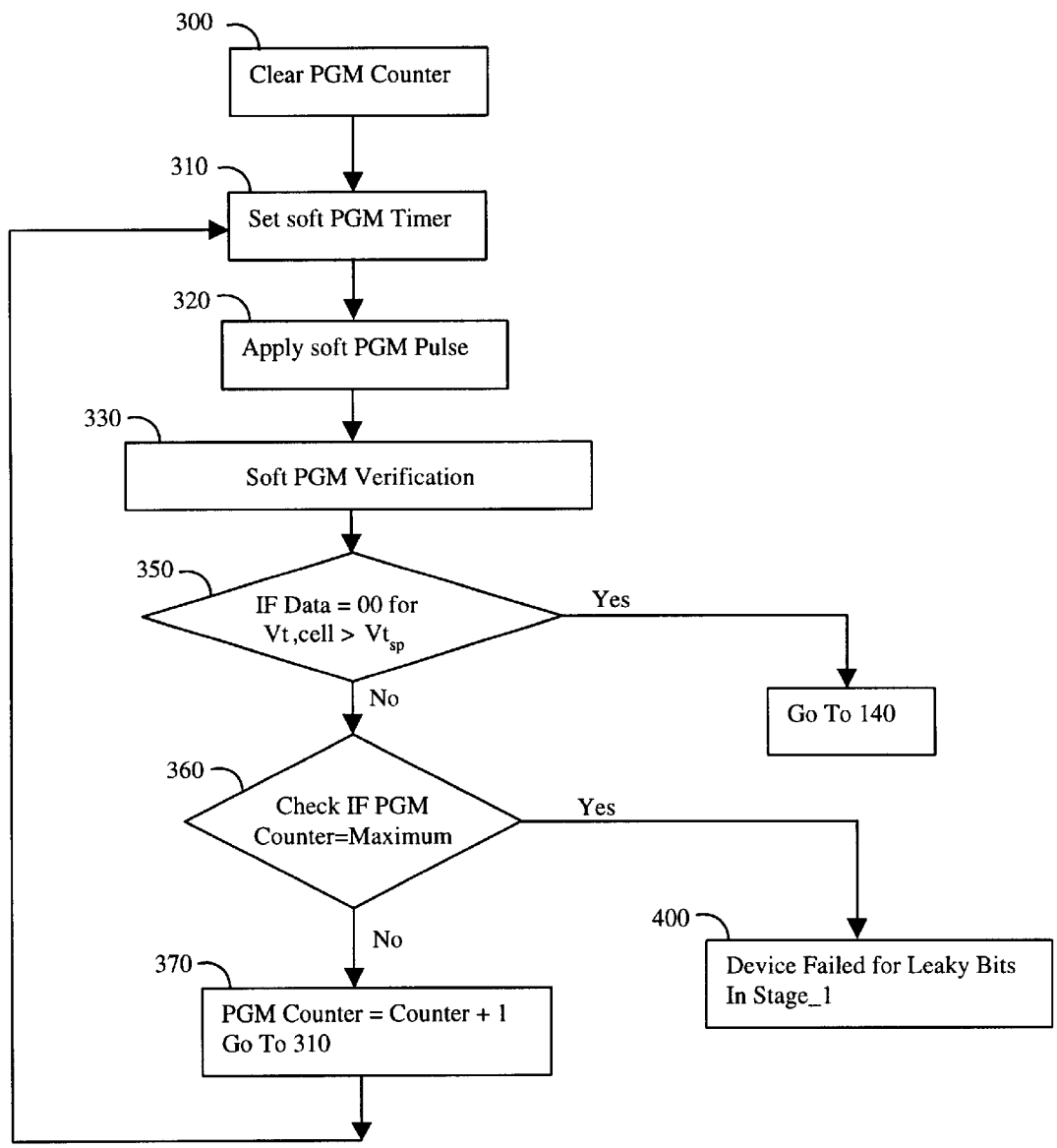
FIG. 3B is a flow chart diagram describing a process used in the present invention to correct detected over-erased memory cells before an erase operation is performed.

If as a result of the verification above any over-erased bits are identified, an over-erase correction process is then applied only to such over erased bits as shown in the flow chart of FIG. 3B before each erase actually starts. An adjustable program counter is cleared at step 300, and a soft program timer is set at step 310 as controls for this particular routine. These variables, in other words, can be adjusted as necessary based on system considerations so that excessive time is not devoted to overly leaky bits that are not fixable. After receiving a soft program pulse in step 320, any over erased bits are verified in step 330 to see if they can pass the current leakage check in step 350. After the bits have passed the soft program verification, the over-erase correction routine returns control to the over-erase detection routine at step 140 of FIG. 3A for the next address for the detection of any other over erased bits. However, if the bits do not pass the soft program verification, the correction method is applied again until the over erased bits can pass the leakage check at 350, or alternatively, there is an indication to the system at step 400 that the bits cannot be fixed. In such cases, absent some form of redundancy repair (which can be implemented under certain circumstances in limited environments using known techniques) the device is identified as failing. The soft program pulse at step 320 is not a typical "program" pulse as conventionally used in the art. Instead, a threshold adjustment voltage signal is used to adjust threshold voltages of any over-erased cells, so that threshold voltages for any of such cells are distributed between $Vt_{emin}$ and $Vt_{emax}$ where $V_{emax}$ is a maximum and $Vt_{emin}$ a minimum target threshold voltage value for a cell in an erased state. [In the preferred embodiment we have discovered that a signal of approximate duration 0.01 msec, and with an amplitude of 5 volts is best used for a block of 8 cells having an approximate floating gate size of 0.4 $\mu$m by 0.4 $\mu$m. This signal is applied to the control gate of the cell while the bitlines are biased at 5 volts. It should be noted, however that the particular implementation of this soft program pulse will vary significantly according to the specifics of the device in question, and the present invention is by no means limited by the particulars of this soft program pulse. Therefore the soft program pulse $Vt_{sp}$ is applied, on a cell by cell as needed basis, to push the threshold voltage of such cell into a region bounded by $Vt_{emin}$ and $Vt_{emax}$.

Figure 4A:
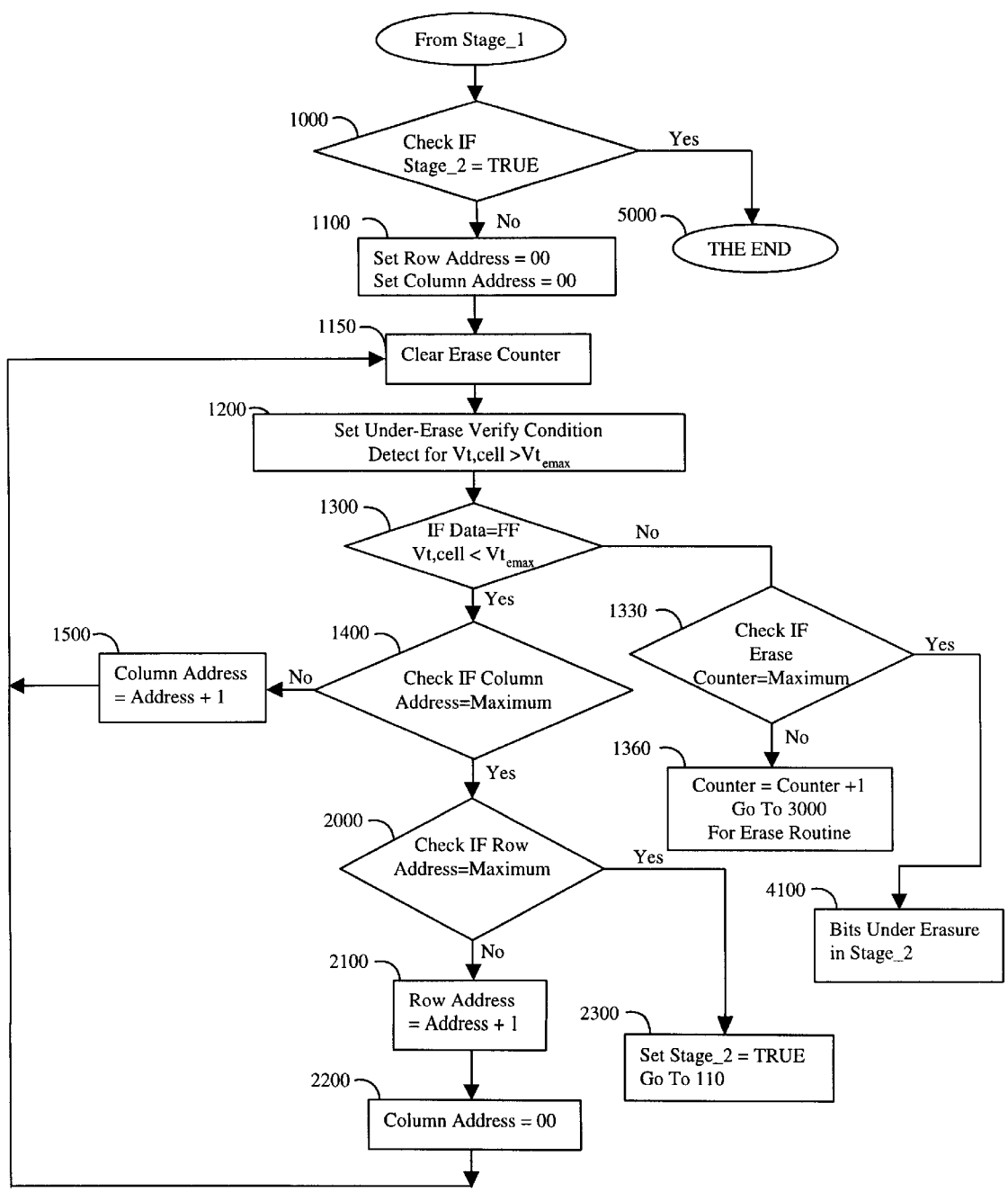
FIG. 4A is a flow chart describing a method used in the present invention to provide means for the detection of under-erased memory cells in the flash EEPROM.
Figure 5:
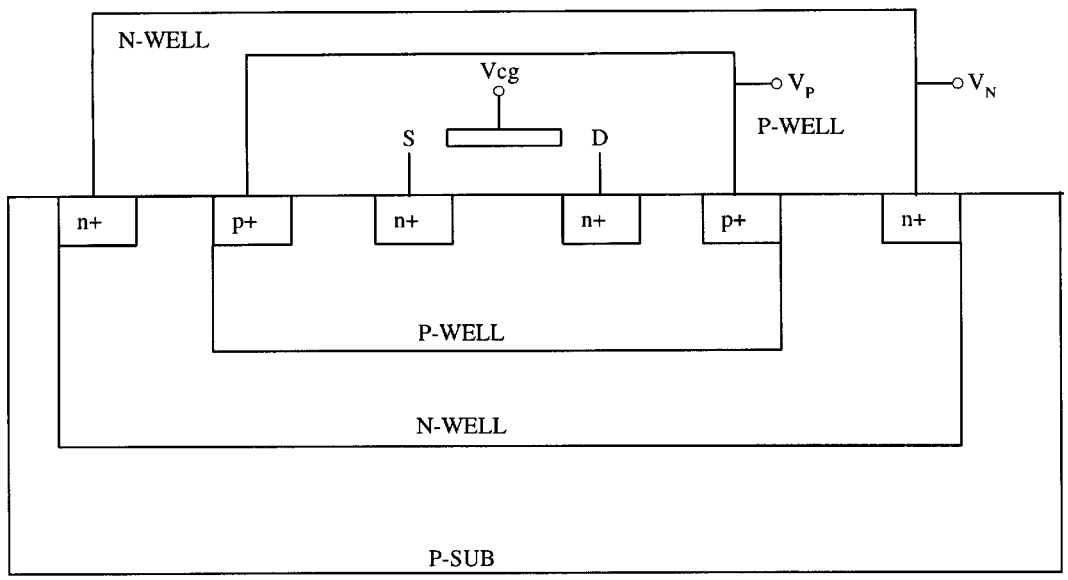
FIG. 5 is a cross sectional view of a typical flash core cell.

If no further over-erased bits are detected, then the flash memory array will be checked for under-erasure in FIG. 4A before each erase. An erase takes place in the present invention only if under-erased bits are detected. Otherwise, no further erase is performed on the flash memory array. As will be appreciated by those skilled in the art, this is significantly different than in the prior art where all bytes are pre-programmed before each erase. Mandatory programming before erase has a number of disadvantages, including the fact that it takes extra time, requires extra power, excessively and unnecessarily stresses the physical structure of the cells, and disturbs the threshold voltages of such cells. Moreover, even if a single byte needs to be altered, it is necessary to reprogram an entire device, which is very inefficient. Mandatory programming before erase is also inefficient in that there may not actually be any under-erased cells in the array, and thus there may be no reason for an erase as well. If, however, one practices the prior art and programs the array indiscriminately, there will definitely be under-erased cells that need to be erased even if there were none previously. It can be seen, therefore, that the present invention also saves wear and tear on the memory cells for the reason that unnecessary erasures are also prevented in many cases.

Figure 4B:
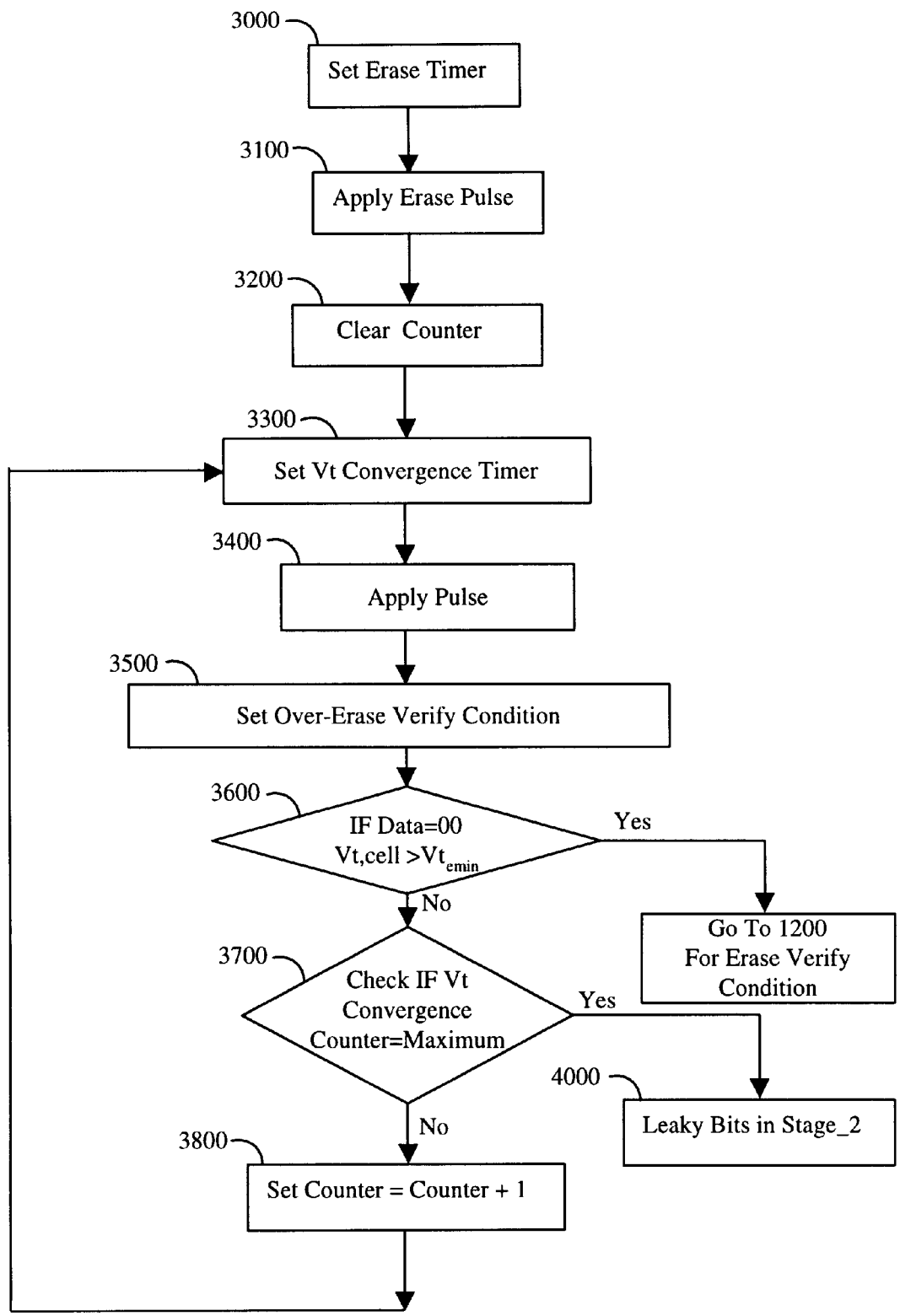
FIG. 4B is another flow chart illustrating a method used in the present invention to tighten erased memory cell threshold voltages in a flash EEPROM.
Figure 6:
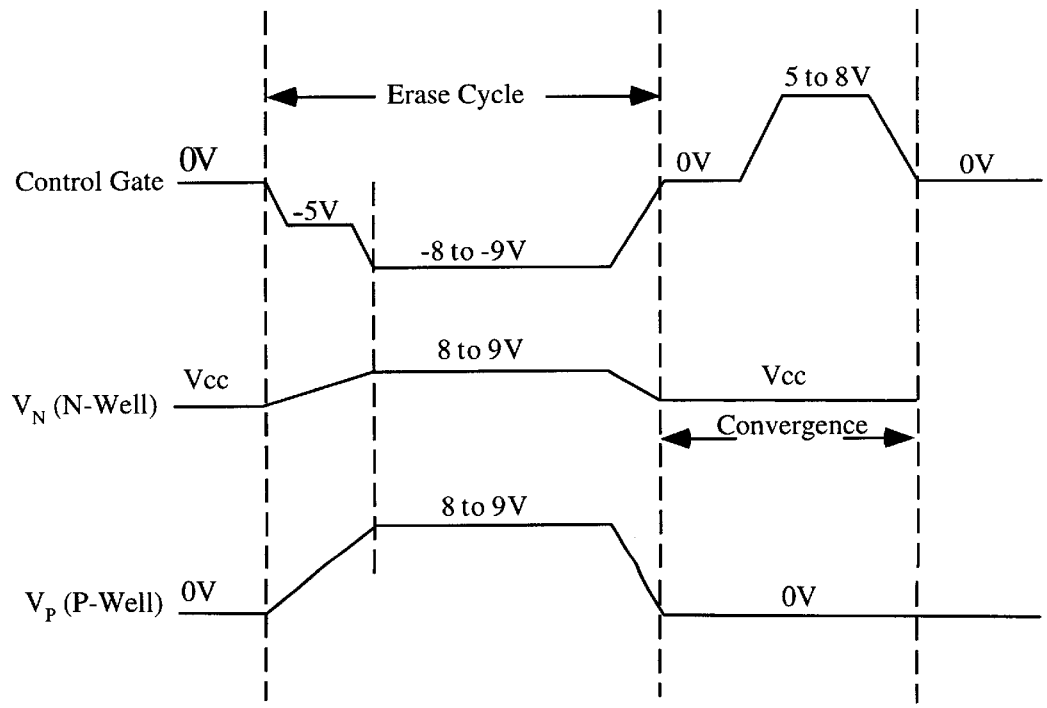
FIG. 6 is a diagram depicting the timing of the various voltages as applied by the present invention during a flash EEPROM embedded erase process.

In the present invention, therefore, an under-erase detection routine is executed prior to any erase, as depicted generally in FIG. 4A. After the over-erase detection and over-erase correction routines are completed as noted above, the under-erase detection routine begins at step 1000, where it first verifies whether the routine has previously completed; if so, it exits at 5000. Otherwise, step 1100 sets up appropriate address counters to check every bit in the array. At 1150 an erase counter is cleared; the erase counter is analogous to the PGM counter in the over-erase correction routine in that it can be used to control the degree of effort made by the present invention to correct a stubborn bit. At step 1200 the flash memory array is checked to see if any under erased bits exist. If any bits in the memory array are under erased, the data for such byte would not be read as 'FF' in step 1300. In the event under-erased bits are detected (and only when this is the case) an under-erase correction routine is executed as shown in FIG. 4B and discussed further below. Otherwise, the present routine checks for the end of the column addresses at step 1400, and then proceeds as necessary to the next column address in step 1500 to detect for any other under erased bits again in step 1200. After all column addresses on one row have been completely checked, detection for under-erased bits continues on the next row in step 2000 and step 2100 beginning with column 00 at step 2200. The process of detecting under-erased bits continues until all bytes in the flash memory array pass the verification as in step 2300, or alternatively, if certain stubborn bits cannot be corrected, the erase counter reaches its maximum value at step 1330 and the routine notifies the controller at step 4100 of this fact. Again, in some instances it is possible to correct such stubborn bits, but such discussion is not germane to the present invention. The under-erase detection routine then returns control back to step 110 (FIG. 3A) where detection begins again for over-erased bits which may have been caused by an under-erase correction procedure as described in FIG. 4B. In FIG. 4B this routine proceeds as follows: an erase timer is set at step 3000 and an erase pulse is applied to the flash memory array at step 3100. After the erase pulse has been applied at step 3100, a unique convergence procedure is initiated at step 3200 for tightening (narrowing) threshold voltage (Vt) distributions of the erased cells. A timing diagram in FIG. 6 shows that the erase pulse is applied globally to the array during a first erase cycle. After this, a second convergence cycle occurs as shown there, with voltages and timing as noted. The convergence cycle is controllable by a number of parameters. First, as noted at step 3200, a convergence counter, which can be set by the controller, is reset prior to Vt adjustments. A convergence timer 3300 determines the length of the convergence cycle shown in FIG. 6, and, again, is programmable and manipulable by a control circuit. At step 3400 the signal voltages shown in the convergence cycle in FIG. 6 are applied in the manner shown to input terminals $V_P$ and $V_N$. The amplitude, frequency and duration of this voltage will vary from array to array, and should be determined by individual characteristics of such arrays so that the threshold voltage distributions are narrowed as much as possible to converge on a target threshold. In general, the goal of the convergence procedure is to set the threshold voltages to a value $Vt_{cp}$, where again, in a preferred embodiment, $Vt_{cp}=Vt_{emin}$. Unlike the soft program pulse described above, however, the convergence cycle applies the convergence signals (both soft erase and soft program) to all cells in the array, and not on a cell by cell basis.

Verification of potential over-erasure after each such soft convergence erase pulse is implemented in step 3500. If the bits are not over-erased, the data read in step 3600 should be '00' and verification of these same bits for under-erase would then take place beginning with step 1200 in FIG. 4A. If the data of the bits is not '00', further compression or tightening of the erased Vt distribution is effectuated as shown in step 3700, step 3800 and then back again to step 3400. This procedure continues until no more over-erased bits are detected through the method of globally tightening the erased Vt distribution, or until the routine drops out at 4000 because the bits in question are too leaky, and therefore cannot be easily corrected.

Figure 1B:
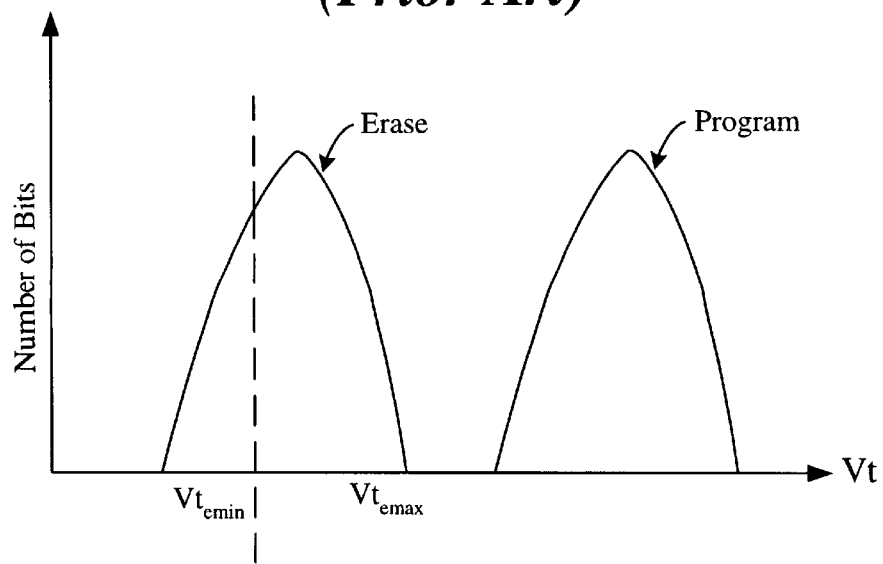
FIG. 1B is a graphical chart illustrating voltage threshold distributions for cells in a typical prior art memory cell array.

Based on theoretical observations, simulations and experimental data, applicants believe that the aforementioned convergence cycle is extremely advantageous for adjusting threshold voltages of flash memory cells. This conclusion is based further on the applicants' observation that a soft erase pulse applied to a set of cells will generally result in a larger downward change in threshold voltage for cells already having a higher Vt. Similarly, a soft program pulse applied to a set of cells will generally result in a larger upward change for cells having a lower Vt. In other words, in FIG. 1B, during a soft erase, cells at the high end (high Vt) of the distribution curve will tend to move proportionately lower in an absolute sense than cells at the low (low Vt) of the distribution curve. Correspondingly, during a soft program, cells at the low end (low Vt) of the distribution curve will tend to move proportionately higher in an absolute sense than cells at the high end (high Vt) of the distribution curve. It can be seen, therefore, that the convergence cycle has the effect of alternatively pulling the top and bottom edges of the voltage distributions closer together.

Again, since the present invention obviates the need to pre-program all bytes in a flash memory array before each erase, the present invention provides a very advantageous solution for low power applications in that power consumption to pre-program all bytes before each erase in the said flash memory array is saved. As a result, the norminal battery life in the low power applications is enhanced and prolonged. Preprogramming of all bytes before each erase in a flash memory array also exerts unnecessary electrical stress on the memory array which definitely results in the acceleration of device performance and reliability degradation.

It is evident that an integrated circuit can be manufactured using conventional processing means to include a control circuit configured in accordance with the teachings of the present invention. Such article of manufacture could include the inventive control circuit taken in combination with a typical flash memory cell array and conventional supporting peripheral circuitry (power supplies, address decoders, I/O data buffers, sense amplifiers, reference arrays, counters, timers, etc.). Such processing means and peripheral circuitry can be implemented using any of a number of structures and methods well-known in the art, and are therefore not described here in substantial detail. In any event, finished integrated circuit articles embodying the present invention will exhibit superior performance since better, more uniform voltage threshold populations will be implemented during the manufacturing process.

The above routines for implementing the inventive processes are provided merely by way of example, and are not intended to be limiting of the present invention in any respect. Other variations of the routines will become evident to those skilled in the art based on the teachings herein. Accordingly, it is intended that the all such alterations and modifications be included within the scope and spirit of the invention as defined by the following claims.

What is claimed is:

1. A method of correcting over-erased memory cells in a flash memory cell array, including the steps of:

(a) detecting the existence of any over-erased cells, such over-erased cells having a threshold voltage below a threshold voltage $Vt_{emin}$, where $Vt_{emin}$ is a minimum target threshold value for a cell in an erased state;

(b) generating a threshold adjustment voltage signal, which adjustment signal is not applied to the entire array, to adjust threshold voltages of any over-erased cells, so that threshold voltages for any of such cells are set to an approximate threshold voltage $Vt_{sp}$, where $Vt_{sp}$ has a value greater than or equal to $Vt_{emin}$ and less than $Vt_{emax}$, where $Vt_{emax}$ is a maximum target threshold value for a cell in an erased state.

2. The method of claim 1, further including a step (c): detecting the existence of any under-erased cells, such under-erased cells having a threshold voltage greater than $Vt_{emax}$.

3. The method of claim 2, further including a step (d): applying an erase pulse to said array.

4. The method of claim 3, wherein the erase pulse is applied only if the results of step (c) indicate the existence of under-erased cells.

5. The method of claim 3, further including a step (e): detecting the existence of any over-erased cells caused by the erase pulse, and, adjusting threshold voltages in the array during a convergence cycle as necessary to correct such over-erased cells.

6. The method of claim 5, wherein the convergence cycle applies a soft program pulse to said array, and then returns to step (c) so that threshold voltages of cells in said array converge.

7. The method of claim 3, wherein the erase pulse is applied without first applying a program pulse immediately prior to the erase pulse.

8. The method of claim 1, wherein the threshold adjustment signal is a soft program pulse used to control the threshold voltages of cells in the array on a cell by cell basis.

9. A method of controlling a distribution of threshold voltages of memory cells in a flash memory cell array, including the steps of:
   (a) detecting any over-erased cells;
   (b) if any over-erased cells are detected, adjusting only such over-erased cells by applying a first adjustment signal to modify the over-erased cell threshold voltages to be approximately equal to $Vt_{sp}$, where $Vt_{emin} <= Vt_{sp} <= Vt_{emax}$, and where $Vt_{emin}$ and $Vt_{emax}$ represent minimum and maximum target threshold voltage values for a cell in an erased state, respectively; and
   (c) detecting any under-erased cells; and
   (d) if any under-erased cells are detected, generating an erase pulse that is applied to the entire array;
   (e) applying a second and third adjustment signal to compress said threshold voltages to a range between $Vt_{emin}$ and $Vt_{emax}$ by adjusting threshold voltage values of both over-erased and under-erased cells.

10. The method of claim 9, wherein a program pulse is not applied to the array used prior to applying the erase pulse at step (d).

11. The method of claim 9, wherein the erase pulse is only applied if any under-erased cells are detected.

12. The method of claim 9, wherein during step (e) threshold voltages in the array are adjusted during a convergence cycle as necessary to correct any over-erased cells.

13. The method of claim 12, wherein the convergence cycle includes applying a soft program pulse to said array such that threshold voltages of cells in said array converge.

14. A method of correcting threshold voltage values for over-erased memory cells in a flash memory cell array, including the steps of:
   (a) detecting the existence of any over-erased cells, said over-erased cells having a threshold voltage below a threshold voltage $Vt_{emin}$, where $Vt_{emin}$ is a minimum target threshold value for a cell in an erased state;
   (b) adjusting said threshold voltages of said over-erased cells by generating a threshold adjustment voltage signal, said adjustment voltage signal being configured and applied to such over-erased cells in order to set threshold voltages for over-erased cells to a value between $Vt_{emin}$ and $Vt_{emax}$, where $Vt_{emax}$ is a maximum target threshold value for a cell in an erased state; and wherein said adjusting step is performed without applying said threshold adjustment voltage signal to all of such cells in such array.

15. The method of claim 14, wherein said threshold adjustment signal is applied repeatedly to such cell in such array until such cell has a threshold voltage between $Vt_{emin}$ and $Vt_{emax}$ or until such cell is determined to be not fixable.

16. The method of claim 14, wherein said threshold adjustment signal is applied to such over-erased cell for a maximum number of times based on a value in a programmable program counter associated with such adjusting step.

17. The method of claim 14, wherein said threshold adjustment signal is applied to such over-erased cell for a signal duration based on a value in a programmable timer associated with such adjusting step.

18. The method of claim 14, wherein said threshold adjustment signal is applied to a control gate of such cell, and has a value of less than approximately 5 volts.

19. A method of erasing memory cells in a flash memory cell array, including the steps of:
   (a) applying an erase pulse to the array during an erase operation; and
   (b) adjusting threshold voltages of such cells after such erase operation with a threshold adjustment signal, so that such erased cells have a threshold voltage above a threshold voltage $Vt_{emin}$, where $Vt_{emin}$ is a minimum target threshold value for a cell in an erased state, and such cells further have a threshold voltage value below $Vt_{emax}$, where $Vt_{emax}$ is a maximum target threshold voltage value for a cell in an erased state; and
   wherein such array is erased without first pre-programming such cells to a program threshold voltage value $Vt_{pmin}$, where $Vt_{pmin}$ is a minimum program threshold value for such array, and $Vt_{pmin} > Vt_{emax}$.

20. The method of claim 19, wherein during step (b), said threshold adjustment signal includes both a a soft program and soft erase signal applied to the array as needed to adjust the threshold voltage values to a target erase value $Vt_{sp}$.

21. The method of claim 20, further including a step (c): detecting and correcting any over-erased cells on a cell-by-cell basis.

22. The method of claim 19, further including a step prior to step (a): determining whether any cells in such array are under-erased before applying said erase pulse.

23. The method of claim 19, wherein said threshold adjustment signal is applied repeatedly to such array until such cells have a threshold voltage between $Vt_{emin}$ and $Vt_{emax}$ or until one or more cells are determined to be not fixable.

24. The method of claim 19, wherein said threshold adjustment signal is applied to such array for a maximum number of times based on a value in a programmable program counter associated with such adjusting step.

25. The method of claim 19, wherein said threshold adjustment signal is applied to such over-erased cell for a signal duration based on a value in a programmable timer associated with such adjusting step.

26. A method of controlling voltage threshold distributions of memory cells in a flash memory cell array, including the steps of:
   (a) detecting any over-erased cells; and
   (b) correcting any such over-erased cells; and
   (c) detecting any under-erased cells; and
   (d) applying an erase pulse to the array during an erase operation, such erase pulse being applied without first pre-programming such cells to a program threshold voltage value $Vt_{pmin}$, where $Vt_{pmin}$ is a minimum program threshold value for such array, and $Vt_{pmin} > Vt_{emax}$ where $Vt_{emax}$ is a maximum target threshold voltage value for a cell in an erased state.

27. The method of claim 26 further including a step (e): adjusting threshold voltages of such cells after such erase operation, so that such erased cells have a threshold voltage above a threshold voltage $Vt_{emin}$, where $Vt_{emin}$ is a minimum target threshold value for a cell in an erased state, and such cells further have a threshold voltage value below $Vt_{emax}$.

28. The method of claim 27, wherein during step (e), soft program and soft erase signals are applied to the array as needed to adjust the threshold voltage values to a target erase value $Vt_{sp}$.

29. The method of claim 27, wherein said soft program and soft erase signals are applied repeatedly to such array until such cells have a threshold voltage between $Vt_{emin}$ and $Vt_{emax}$ or until one or more cells are determined to be not fixable.

30. A method of converging voltage thresholds of memory cells in a flash memory cell array, including the steps of:
    (a) detecting the existence of any over-erased cells, such over-erased cells having a threshold voltage below a threshold voltage $Vt_{emin}$, where $Vt_{emin}$ is a minimum target threshold value for a cell in an erased state;
    (b) detecting the existence of any under-erased cells, such under-erased cells having a threshold voltage above a threshold voltage $Vt_{emax}$, where $Vt_{emax}$ is a maximum target threshold value for a cell in an erased state;
    (c) generating a first type of threshold adjustment voltage signal to adjust threshold voltages of any over-erased cells;
    (d) generating a second type of threshold adjustment voltage signal to adjust threshold voltages of any under-erased cells;
       wherein threshold voltages for such cells converge during steps (a) to (d) to a value between $Vt_{emin}$ and $Vt_{emax}$.

31. The method of claim 30, wherein said first and second threshold adjustment signals are applied repeatedly until each cell has a threshold voltage between $Vt_{emin}$ and $Vt_{emax}$ or until such array is determined to be not fixable.

32. The method of claim 30, wherein said first and second threshold adjustment signals are applied to such array for a maximum number of times based on a value in a programmable program counter associated with such adjusting steps.

33. The method of claim 30 wherein said first and second threshold adjustment signals are applied to such array for a signal duration based on a value in a programmable timer associated with such adjusting step.

34. A method of converging voltage thresholds of memory cells in a flash memory cell array, including the steps of:
    (a) erasing the memory cells using an erase pulse;
    (b) detecting the existence of any over-erased cells from such erase pulse, such over-erased cells having a threshold voltage below a threshold voltage $Vt_{emin}$, where $Vt_{emin}$ is a minimum target threshold value for a cell in an erased state;
    (c) applying a soft program signal to such array when any over-erased cells are detected;
    (d) detecting the existence of any under-erased cells, such under-erased cells having a threshold voltage above a threshold voltage $Vt_{emax}$, where $Vt_{emax}$ is a maximum target threshold value for a cell in an erased state;
    (e) applying a soft erase signal to such array when any under-erased cells are detected;
       wherein threshold voltages for such cells are adjusted with said soft program and soft erase signals to converge to a value between $Vt_{emin}$ and $Vt_{emax}$.

35. The method of claim 34, wherein said cells are erased without first being pre-programmed.

36. The method of claim 34, further including a step prior to step (a): determining whether any cells in such array are under-erased before applying said erase pulse.

37. The method of claim 34, further including a step prior to (a): detecting the existence of any over-erased cells, and, adjusting threshold voltages in the array during a convergence cycle as necessary to correct such over-erased cells.

38. The method of claim 34, wherein the soft erase pulse is applied without first applying a soft program pulse prior to the soft erase pulse.

* * * * *